US011294985B2

(12) United States Patent
Mathuriya et al.

(10) Patent No.: US 11,294,985 B2
(45) Date of Patent: Apr. 5, 2022

(54) EFFICIENT ANALOG IN-MEMORY MATRIX MULTIPLICATION PROCESSOR

(71) Applicant: INTEL CORPORATION, Santa Clara, CA (US)

(72) Inventors: Amrita Mathuriya, Portland, OR (US); Sasikanth Manipatruni, Portland, OR (US); Dmitri Nikonov, Beaverton, OR (US); Ian Young, Portland, OR (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 643 days.

(21) Appl. No.: 16/175,229

(22) Filed: Oct. 30, 2018

(65) Prior Publication Data

US 2020/0133990 A1 Apr. 30, 2020

(51) Int. Cl.
*G06F 17/16* (2006.01)
*G11C 7/12* (2006.01)
*G06N 3/063* (2006.01)

(52) U.S. Cl.
CPC ............ *G06F 17/16* (2013.01); *G06N 3/0635* (2013.01); *G11C 7/12* (2013.01)

(58) Field of Classification Search
CPC .......... G06F 17/16; G06N 3/0635; G06J 1/00; G11C 7/12; G11C 11/419; G11C 7/1006; G11C 11/54

USPC ......................................................... 708/607
See application file for complete search history.

(56) References Cited

U.S. PATENT DOCUMENTS

| 10,283,190 | B1 * | 5/2019 | Li ...................... G11C 11/4085 |
| 10,409,887 | B1 * | 9/2019 | Gauria ............... G06F 12/0207 |
| 2019/0236111 | A1 * | 8/2019 | Muralimanohar ...... G06F 17/16 |
| 2021/0182077 | A1 * | 6/2021 | Chen .................. G06Q 30/0271 |

* cited by examiner

*Primary Examiner* — Tan V Mai
(74) *Attorney, Agent, or Firm* — Schwabe, Williamson & Wyatt, P.C.

(57) ABSTRACT

Techniques are provided for efficient matrix multiplication using in-memory analog parallel processing, with applications for neural networks and artificial intelligence processors. A methodology implementing the techniques according to an embodiment includes storing two matrices in-memory. The first matrix is stored in transposed form such that the transposed first matrix has the same number of rows as the second matrix. The method further includes reading columns of the matrices from the memory in parallel, using disclosed bit line functional read operations and cross bit line functional read operations, which are employed to generate analog dot products between the columns. Each of the dot products corresponds to an element of the matrix multiplication product of the two matrices. In some embodiments, one of the matrices may be used to store neural network weighting factors, and the other matrix may be used to store input data to be processed by the neural network.

25 Claims, 11 Drawing Sheets

EFFICIENT ANALOG IN-MEMORY MATRIX MULTIPLICATION PROCESSOR

BACKGROUND

Matrix multiplication often plays a significant role in the neural networks that underlay many artificial intelligence (AI) systems and applications. Matrix multiplication is computationally intensive, however, and so various types of hardware accelerators and digital signal processors exist to perform these calculations. These accelerators typically need to transfer large quantities of data between off-chip memory and a digital processing unit, and this data transfer requirement can impose a significant bandwidth bottleneck on the operation, causing an undesirable increase in latency and power consumption.

Although the following Detailed Description will proceed with reference being made to illustrative embodiments, many alternatives, modifications, and variations thereof will be apparent in light of this disclosure.

DETAILED DESCRIPTION

As previously noted, there remains a number of non-trivial issues with respect to matrix multiplication accelerator systems due to bandwidth limitations associated with the transfer of data from the memory to the digital processing unit. Thus, this disclosure provides techniques for analog in-memory matrix multiplication based on analog processing of the data in a parallel manner, as analog voltage values are read from the memory cells. That is to say, the arithmetic processing occurs in the memory device as a part of the data fetch. The disclosed techniques for analog in-memory processing of the matrix data provide for reduced latency and improved efficiency in AI applications that employ these techniques, such as, for example, deep learning networks and multi-layer perceptrons (MLPs).

The disclosed techniques can be implemented, for example, in integrated circuitry or a chip set. In one such example case, the techniques are implemented in the memory of a computing system or device such as an integrated circuit processor (e.g., on-chip memory or cache), although other embodiments will be apparent. The memory is configured to perform analog in-memory matrix multiplication. In accordance with an embodiment, a methodology to implement these techniques includes storing two matrices in the memory. The first matrix is stored in transposed form such that the transposed first matrix has the same number of rows as the non-transposed second matrix. The method further includes reading columns of the matrices from the memory in parallel, using disclosed bit line functional read operations and cross bit line functional read operations, which are employed to generate analog dot products between the columns, as will be described in greater detail below. Each of the analog dot products corresponds to an element of the matrix multiplication product of the two matrices. In some embodiments, one of the matrices may be used to store analog neural network weighting factors, and the other matrix may be used to store input data to be processed by the analog neural network.

The disclosed techniques can be implemented on a broad range of platforms including laptops, tablets, smart phones, workstations, video conferencing systems, gaming systems, smart home control systems, robots, and personal assistants. In a more general sense, the techniques can be implemented in any number of processor-based systems that include one or more processors and memory. Numerous applications that call for or otherwise entail AI processing, including visual, audio, and other applications, can benefit from the techniques provided, as will be appreciated.

Figure 1:
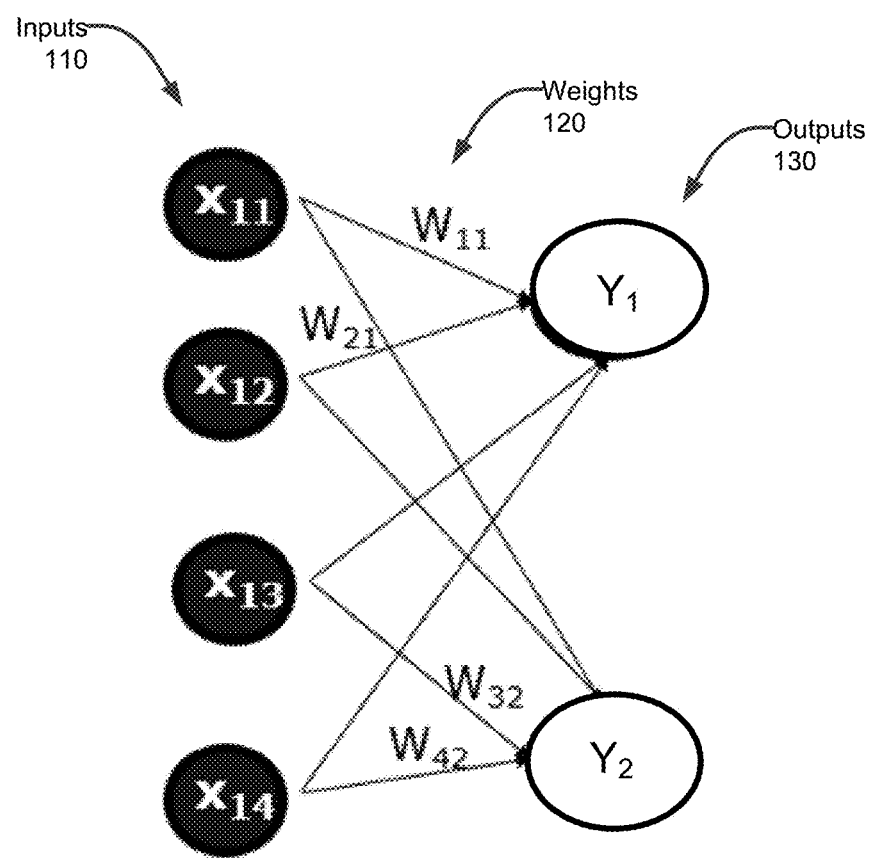
FIG. 1 illustrates an example application of matrix multiplication in a multi-layer perceptron (MLP).
Figure 2:
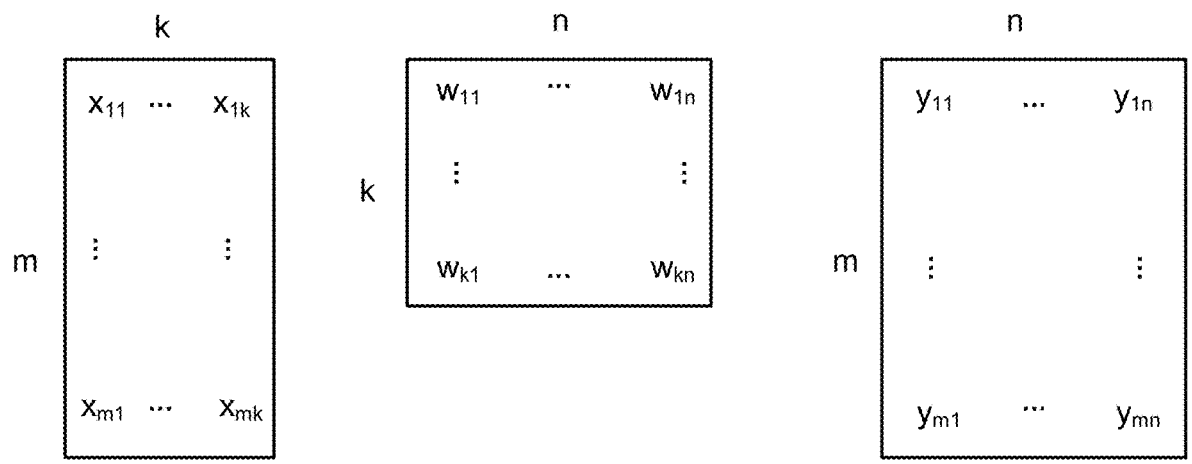
FIG. 2 illustrates example arithmetic operations of a matrix multiplication.

FIG. 1 illustrates an application of matrix multiplication in a multi-layer perceptron 100, as often used in image recognition processing. This simplified example shows a 2-layer perceptron, although in practice the disclosed matrix multiplication techniques may be employed in a more complex multi-layer perceptron or multi-layer analog neural network. The 2-layer perceptron of this example is shown to operate on a number of inputs 110, labeled as X. The inputs are scaled by weighting factors 120, labeled as W, and summed to generate outputs 130, labeled as Y. The operations of this, and many other types of neural networks, can be modeled as a matrix multiplication operation, or series of matrix multiplication operations. This is further illustrated in FIG. 2, which sets out the arithmetic operations 200 of a matrix multiplication Y=X*W. As shown, a first matrix X 110 is multiplied with a second matrix W 120 resulting in a product matrix Y 130. Matrix X is of dimension m×k (i.e., m rows and k columns), matrix W is of dimension k×n (i.e., k rows and n columns), and matrix Y is of dimension m×n (i.e. m rows and n columns). The elements of each matrix are designated by the lowercase letter of the matrix with two subscripts indicating the row and column in that order. For example, $x_{mk}$, indicates the element of matrix X in the last row m and the last column k. Using this notation, each of the m×n elements $y_{ij}$ of the product matrix Y is calculated according to the following formula:

$$y_{ij}=x_{i1}w_{1j}+x_{i2}w_{2j}+ \ldots +x_{ik}w_{kj}$$

which is known as the dot product of the $i^{th}$ row of the Y matrix with the $j^{th}$ column of the X matrix.

Figure 3:
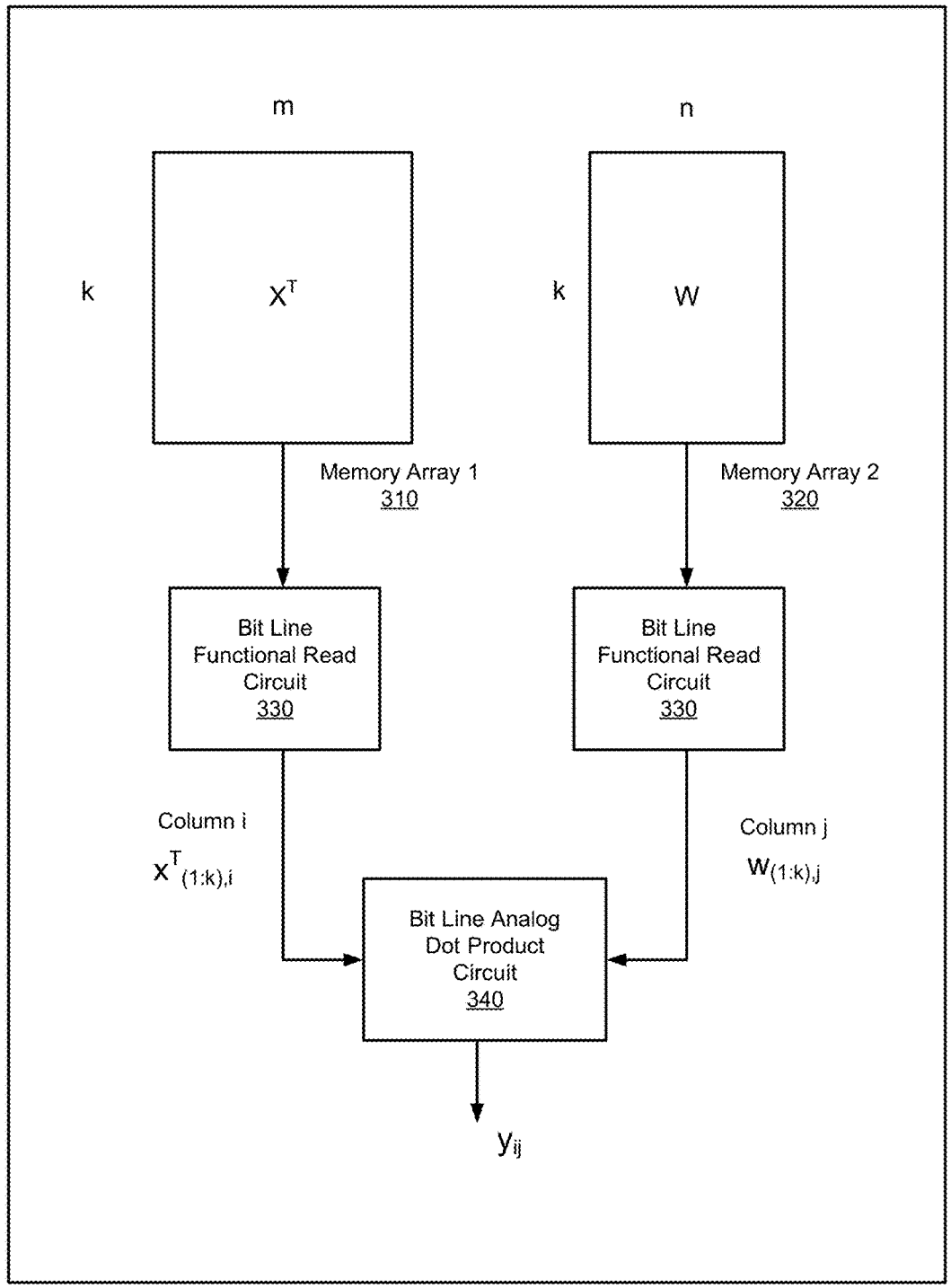
FIG. 3 is a block diagram of an analog in-memory matrix multiplication circuit, configured in accordance with certain embodiments of the present disclosure.

FIG. 3 is a block diagram of an analog in-memory matrix multiplication circuit 300, configured in accordance with certain embodiments of the present disclosure. The memory circuit 300 is shown to include a first memory array region 310, a second memory array region 320, a bit line functional read circuit 330 associated with each of the memory array regions, and a bit line analog dot product circuit 340.

Figure 4:
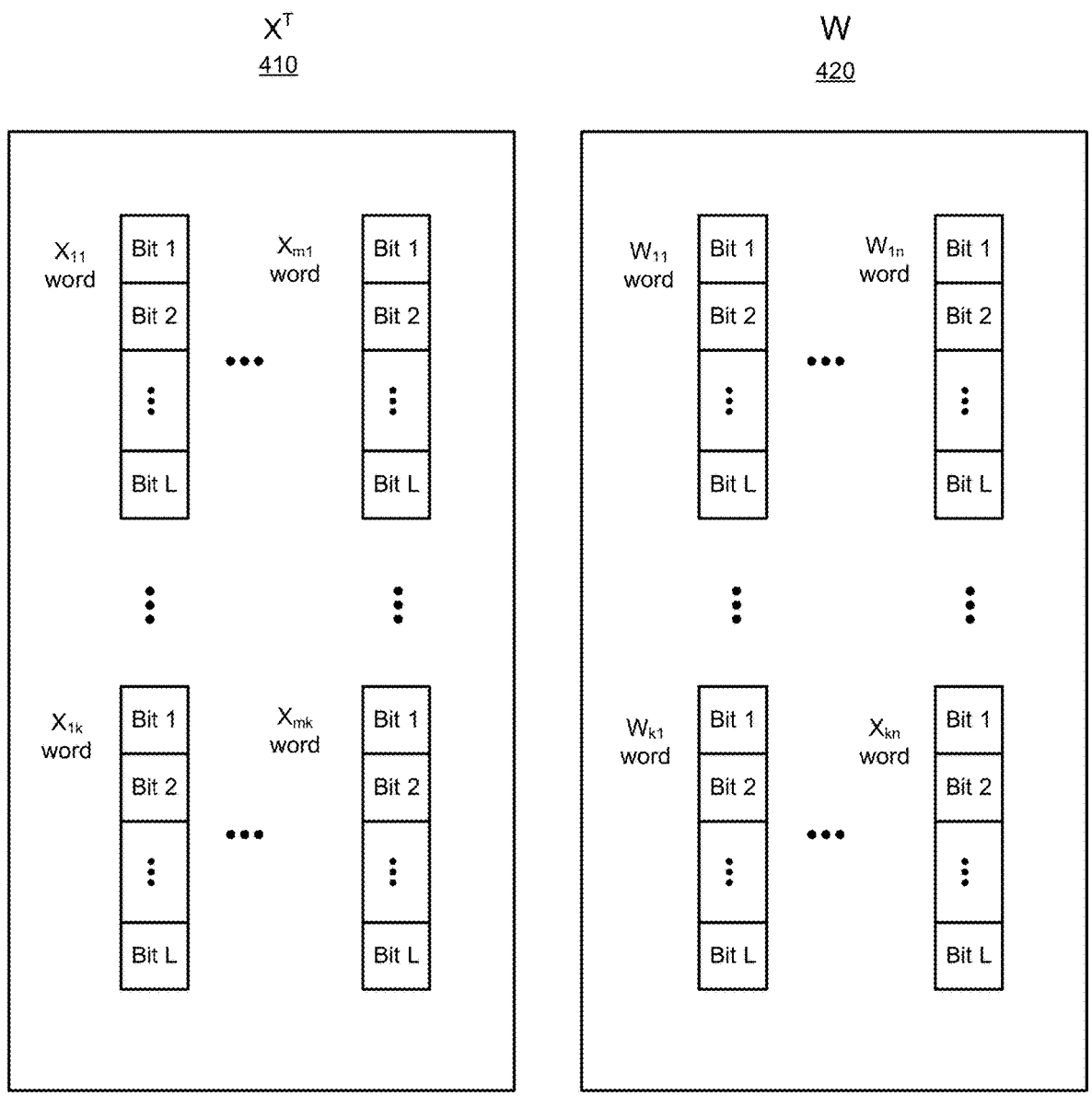
FIG. 4 illustrates a format for the storage of matrices for the analog in-memory matrix multiplication circuit, in accordance with certain embodiments of the present disclosure.

The first memory array region 310 is configured to store the X matrix in transposed form ($X^T$), and the second memory array region 320 is configured to store the W matrix in original (non-transposed) form. The transposition of one of the matrices during storage provides that the number of rows of the two stored matrices in the memory arrays are equal. In some embodiments, the X matrix may be stored in the original (non-transposed) form and the W matrix may be stored in transposed form. FIG. 4 illustrates, in greater detail, the format in which the matrices $X^T$ 410 and W 420 are stored for the analog in-memory matrix multiplication circuit. Each element of the matrix is stored as a data word comprising a selected number L of data bits shown to be arranged in column order. In some such example embodiments, the first memory array region 310 (or 410) storing the X matrix in transposed form ($X^T$) and the second memory array region 320 (or 420) storing the W matrix in original (non-transposed) form are implemented as static random access memory (SRAM), wherein each bit may be stored as an SRAM cell, as further shown in FIG. 4. Other embodiments may employ other memory technologies, whether volatile or non-volatile, such as dynamic RAM (DRAM), resistive RAM (RRAM), and magnetoresistive RAM (MRAM).

Further note that the first and second memory array regions 310/410 and 320/420 may be part of, for example, an on-chip processor cache or a computing system's main memory board, or any other memory facility.

Returning now to FIG. 3, the first bit line functional read circuit 330, associated with the first memory array region 310, is configured to read a selected column i of the $X^T$ matrix (i.e., $X^T$ (1:k), i) and generate a first vector of voltage values. Each of the analog voltage values is proportional to (or otherwise representative of) the k data word elements in the column of the $X^T$ matrix. The analog voltage values of the first vector are generated in parallel. In a similar manner, the second bit line functional read circuit 330, associated with the second memory array region 320, is configured to read a selected column j of the W matrix (i.e., W (1:k), j) and generate a second vector of analog voltage values such that each of the analog voltage values is proportional to (or otherwise representative of) the k data word elements in the column of the W matrix. The analog voltage values of the second vector are generated in parallel.

The bit line analog dot product circuit 340 is configured to calculate an analog dot product between the first vector and the second vector. The analog dot product corresponds to an element of the matrix multiplication product Y of the X matrix and the W matrix. The element is associated with the selected column of $X^T$ (and thus the corresponding row of X) and the selected column j of W. This operation is repeated over a series of first vectors associated with all of the columns of $X^T$ and a series of second vectors associated with all of the columns of W. In this manner, analog dot products are calculated to generate all the elements of the matrix multiplication product Y based on all combinations of columns of the first matrix $X^T$ (i.e., rows of X) and columns of the second matrix W.

In some embodiments, the bit line analog dot product circuit 340 performs the analog multiply portion of the dot product operation by timing current integration over a capacitor. Circuit 340 may be configured as a capacitor in series with a switch. The voltage sensed on the bit line, as one of the multiplicand inputs, generates a current through the capacitor, and the other multiplicand is employed to control the timing of the series switch such that the switch is turned on for a duration proportional to the second multiplicand. The bit line analog dot product circuit 340 performs the analog summation portion of the dot product operation by charge accumulation. For example, in some embodiments, the outputs of the multiplier are provided to a summing capacitor which generates the analog dot product.

Figure 5:
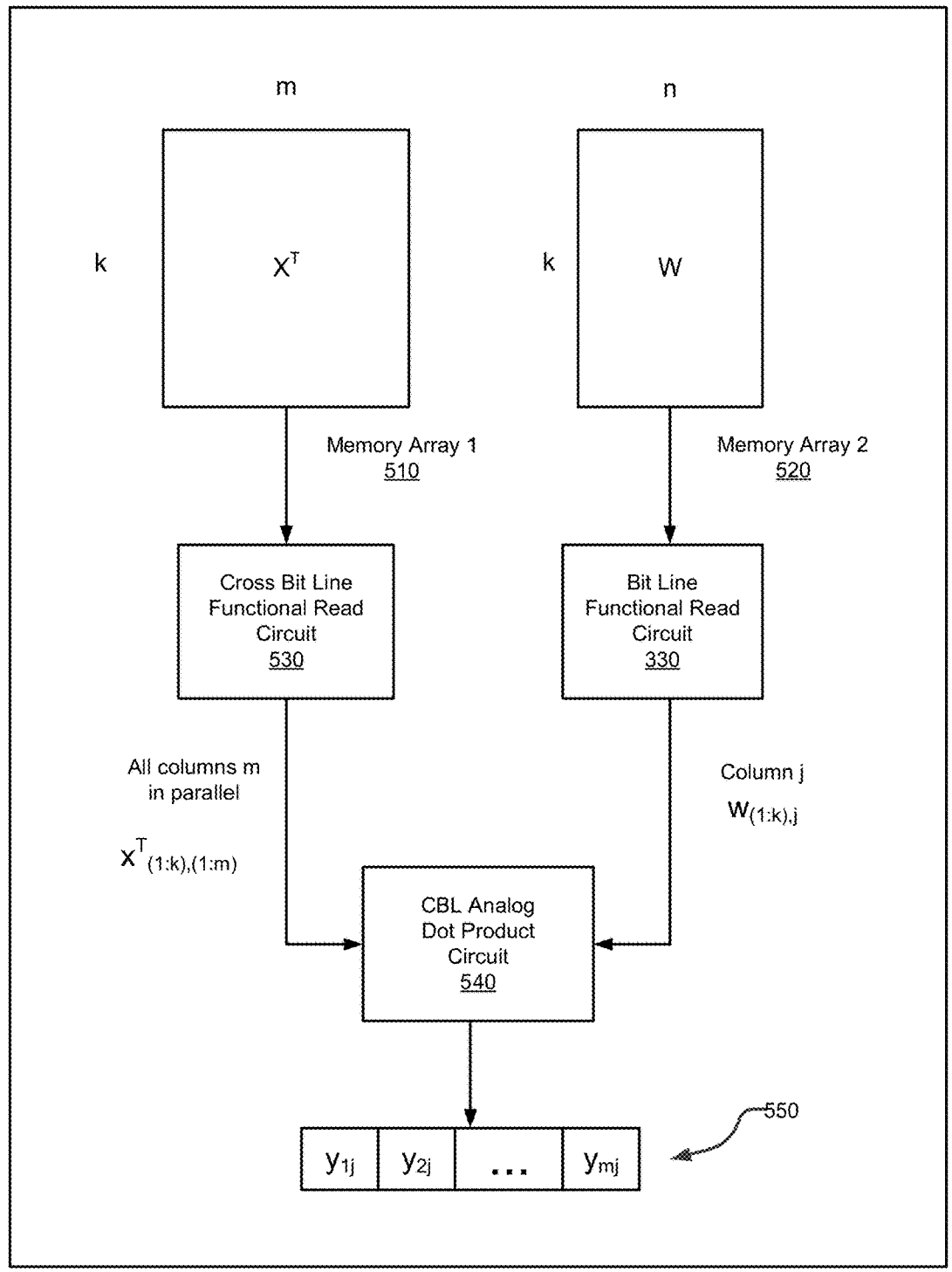
FIG. 5 is a block diagram of another analog in-memory matrix multiplication circuit, configured in accordance with certain other embodiments of the present disclosure.

FIG. 5 is a block diagram of another analog in-memory matrix multiplication circuit 500, configured in accordance with certain embodiments of the present disclosure. The memory circuit 500 is shown to include a first memory array region 510, a second memory array region 520, a cross bit line functional read circuit 530 associated with the first memory array region 510, a bit line functional read circuit 330 associated with the second memory array region 520, and a cross bit line analog dot product circuit 540.

The first memory array region 510 is configured to store the X matrix in transposed form ($X^T$), and the second memory array region 520 is configured to store the W matrix in original (non-transposed) form. As previously described, the transposition of one of the matrices during storage provides that the number of rows of the two stored matrices in the memory arrays are equal. In some embodiments, the X matrix may be stored in the original (non-transposed) form and the W matrix may be stored in transposed form.

The cross bit line functional read circuit 530 is configured to read all m columns of the $X^T$ matrix in parallel (i.e., $X^T$ (1:k), (1:m)) and generate a sequence of vectors of analog voltage values, in parallel. Each of the sequence of vectors is associated with a column of $X^T$ and each of the analog voltage values is proportional to (or otherwise representative of) the k data word elements in the columns of the $X^T$ matrix.

The bit line functional read circuit 330, associated with the second memory array region 520, is configured to read a selected column j of the W matrix (i.e., W (1:k), j) and generate an additional vector of analog voltage values such that each of the analog voltage values is proportional to (or otherwise representative of) the k data word elements in the column of the W matrix. The analog voltage values of the additional vector are generated in parallel.

The cross bit line analog dot product circuit 540 is configured to calculate a sequence of analog dot products 550, in parallel, between each of the sequence of vectors associated with columns of $X^T$ and the additional vector associated with the selected column of W. The analog dot products 550 correspond to elements of the matrix multiplication product Y of the X matrix and the W matrix that are associated with the columns of $X^T$ (and thus the rows of X) and the selected column j of W. This operation is repeated for each column of W, such that analog dot products are calculated to generate all the elements of the matrix multiplication product Y based on all combinations of columns of the first matrix $X^T$ (i.e., rows of X) and columns of the second matrix W. In some embodiments, the cross bit line analog dot product circuit 540 performs the analog multiply portion of the dot product operation and the analog summation portion of the dot product operation in the manner described previously for bit line analog dot product circuit 340.

Figure 6:
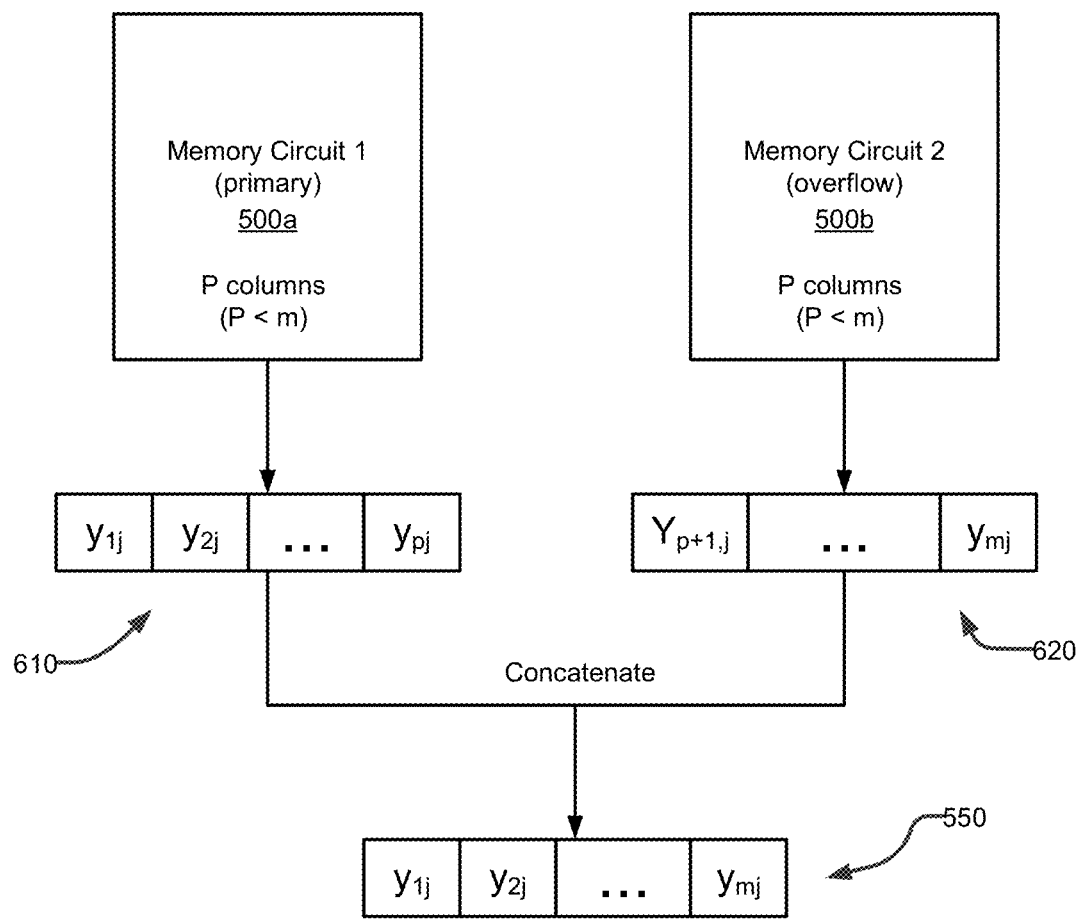
FIG. 6 illustrates the handling of an overflow scenario for an analog in-memory matrix multiplication circuit, in accordance with certain embodiments of the present disclosure.

FIG. 6 illustrates the handling of an overflow scenario 600 for the analog in-memory matrix multiplication circuit, in accordance with certain embodiments of the present disclosure. In this scenario, the number of columns m of $X^T$ exceeds the number of columns P available in the first memory array region 510. To handle this case, a second memory circuit 500b, which will be referred to as the overflow memory circuit, is employed in addition to the primary memory circuit 500a. The primary memory circuit 500a includes the first and second memory array regions of size P columns (P<m) and is configured to generate analog dot products $y_{1j}$ through $y_{pj}$ 610, according to the techniques previously described. The overflow memory circuit 500b includes third and fourth memory array regions to handle the overflow number of columns, and is configured to generate analog dot products $y_{p+1,j}$ through $y_{mj}$ 620, also using these techniques. The partial results 610 and 620 are concatenated to produce the full sequence of m analog dot products 550 corresponding to the elements of Y associated with the selected column j of W. The process is repeated for all columns of W to generate the full matrix Y. Any number of additional overflow memory circuits may be employed, as needed, in cases where m>2P.

Figure 7:
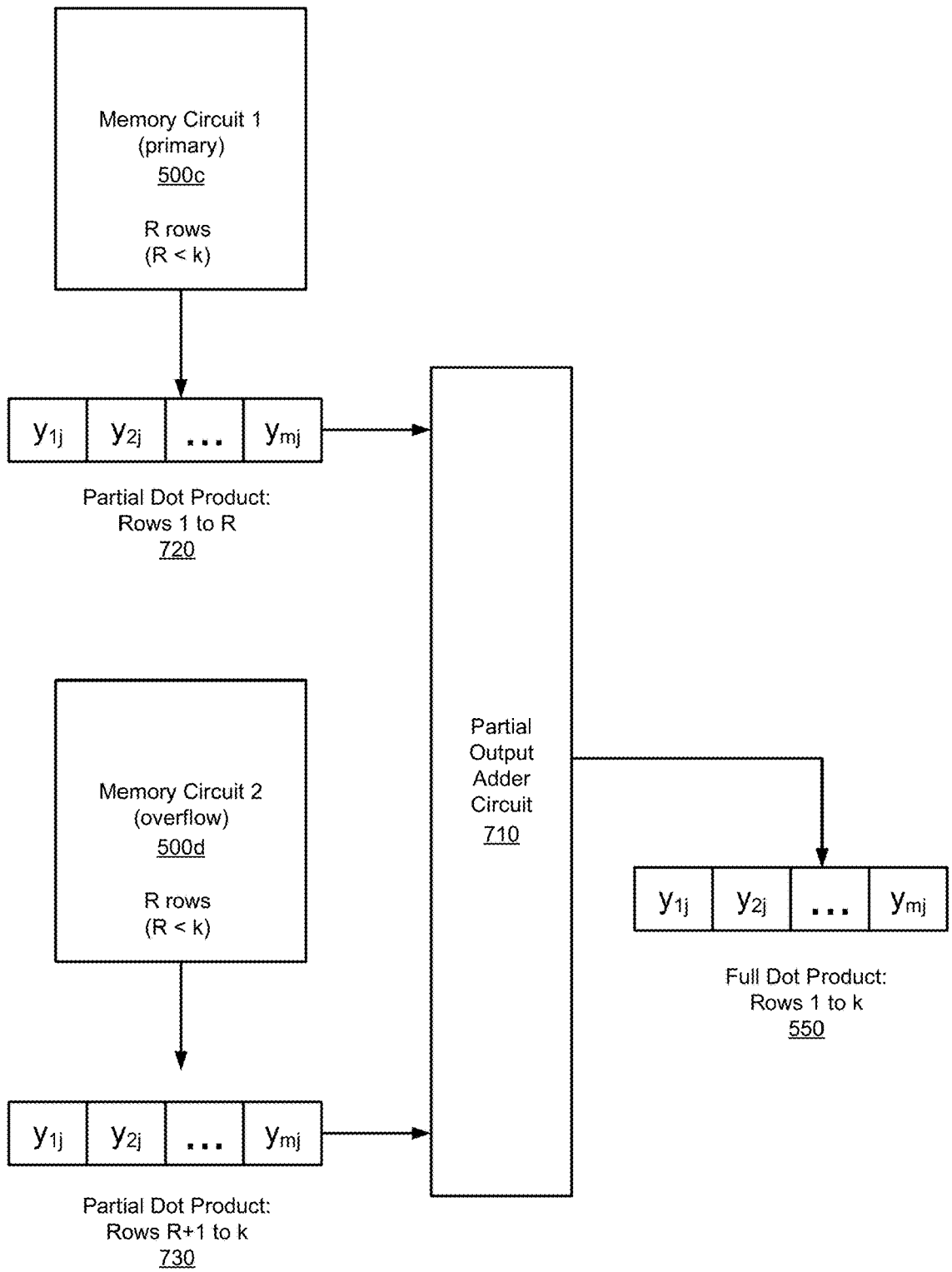
FIG. 7 illustrates the handling of another overflow scenario for an analog in-memory matrix multiplication circuit, in accordance with certain other embodiments of the present disclosure.

FIG. 7 illustrates the handling of another overflow scenario 700 for the analog in-memory matrix multiplication circuit, in accordance with certain embodiments of the present disclosure. In this scenario, the number of rows k of $X^T$ exceeds the number of rows R available in the first memory array region 510. To handle this case, a second memory circuit 500d, which will be referred to as the overflow memory circuit, is employed in addition to the primary memory circuit 500c. The primary memory circuit 500c includes the first and second memory array regions of size R rows (R<k) and is configured to generate partial analog dot products $y_{1j}$ through $y_{mj}$ 720 for rows 1 through R, according to the techniques previously described. The overflow memory circuit 500d includes third and fourth memory array regions to handle the overflow number of rows, and is configured to generate analog dot products $y_{1j}$ through $y_{mj}$ 730 for rows R+1 through k, also using these techniques. Partial output adder circuit 710 is configured to sum the partial analog dot products 720 and 730 to produce the sequence of m analog dot products 550 (based on the sum of all k rows) corresponding to the elements of Y associated with the selected column j of W. The process is repeated for all columns of W to generate the full matrix Y. Any number of additional overflow memory circuits may be employed, as needed, in cases where k>2R.

In the event that both the number of rows and the number of columns of $X^T$ exceed the available space in the first memory array 510, a combination of the techniques described above for handling overflow scenarios 600 and 700 may be employed. Additionally, although the techniques have been described with reference to memory circuit 500, it will be appreciated that these techniques can be similarly applied to memory circuit 300.

Figure 8:
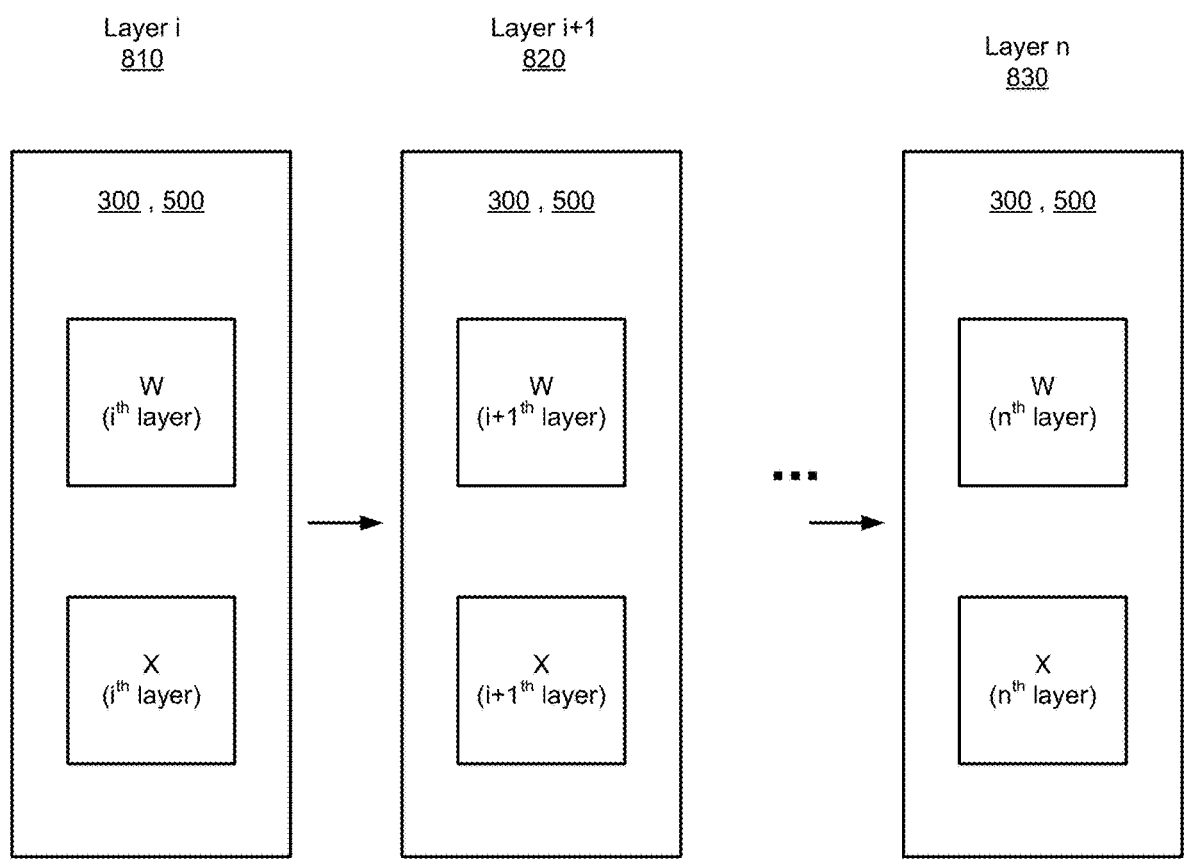
FIG. 8 is a block diagram illustrating cascaded analog in-memory multiplication circuits, configured in accordance with certain embodiments of the present disclosure.

FIG. 8 is a block diagram illustrating cascaded analog in-memory multiplication circuits, configured in accordance with certain embodiments of the present disclosure. The analog in-memory multiplication circuits (e.g., 300 and 500, as described above) may be configured in a cascaded arrangement, as shown, to implement a multi-layer analog neural network. For example, each circuit 300, 500 may be configured to store weights associated with a given network layer 810, 820, 830, and to perform analog in-memory matrix multiplication on data X associated with that layer. The results of the multiplication at each layer may be passed on as data for the next layer such that an output Y of the multi-layer network is calculated as:

$$Y = X * W_1 * W_2 * \ldots W_N$$

Methodology

Figure 9A:
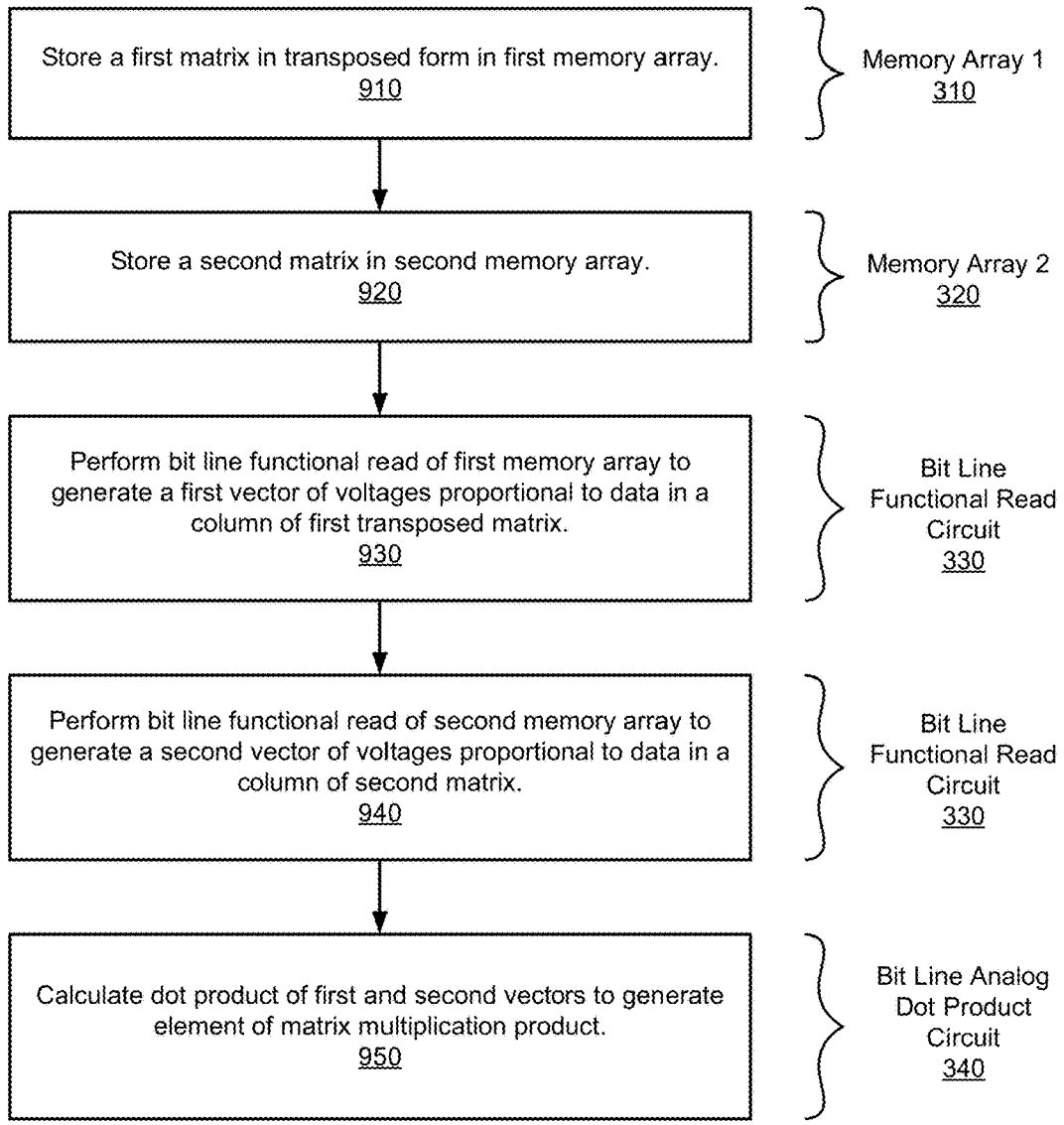
FIGS. 9A and 9B are flowcharts illustrating methodologies for analog in-memory matrix multiplication, in accordance with certain embodiments of the present disclosure.
Figure 9B:
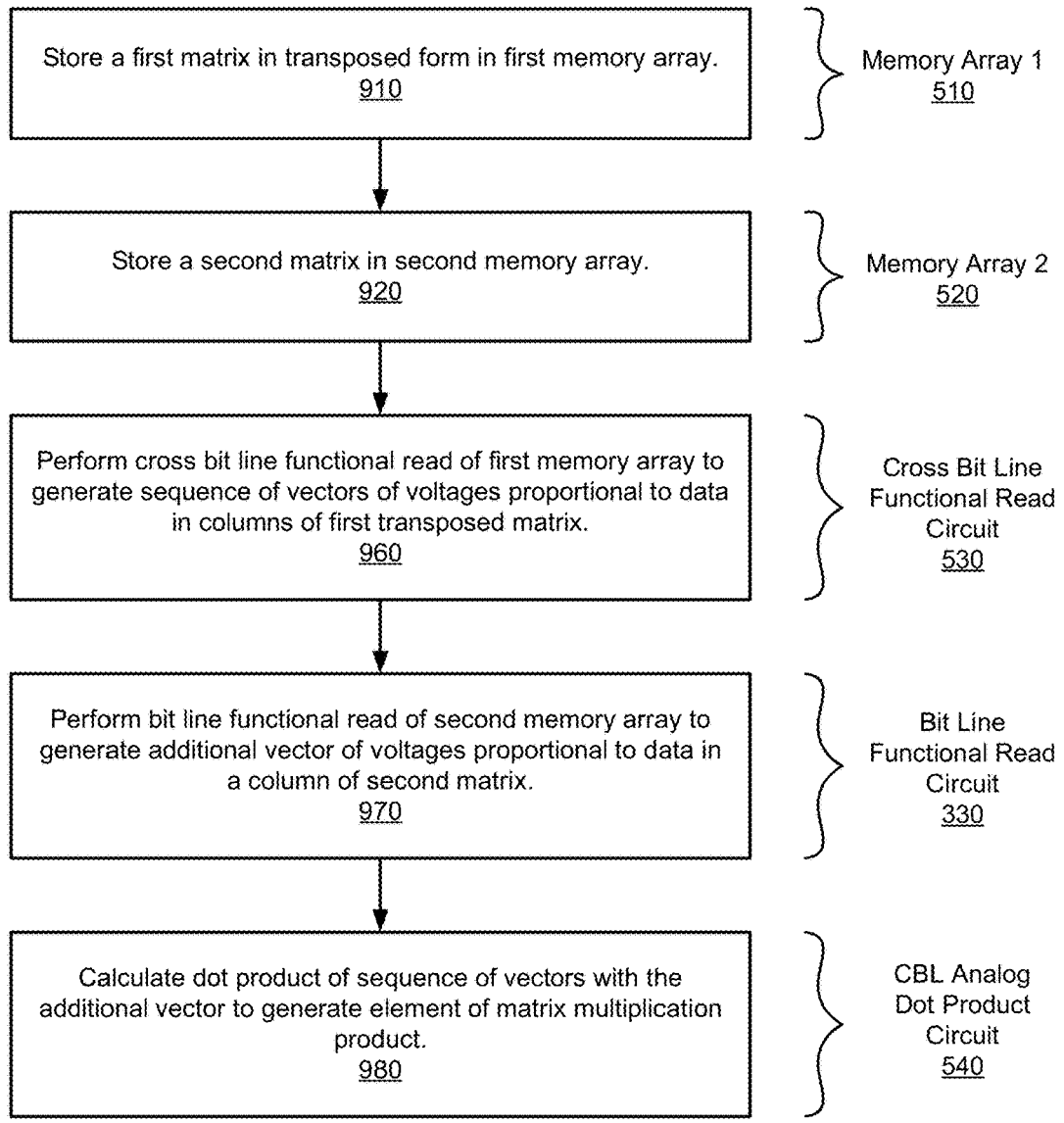

FIGS. 9A and 9B are flowcharts illustrating example methods 900a, 900b for analog in-memory matrix multiplication, in accordance with certain embodiments of the present disclosure. As can be seen, the example method includes a number of phases and sub-processes, the sequence of which may vary from one embodiment to another. However, when considered in the aggregate, these phases and sub-processes form a process for efficient analog in-memory matrix multiplication, in accordance with certain of the embodiments disclosed herein. These embodiments can be implemented, for example, using the system architecture illustrated in FIGS. 3-7, as described above. However other system architectures can be used in other embodiments, as will be apparent in light of this disclosure. To this end, the correlation of the various functions shown in FIGS. 9A and 9B to the specific components illustrated in the other figures is not intended to imply any structural and/or use limitations. Rather, other embodiments may include, for example, varying degrees of integration wherein multiple functionalities are effectively performed by one system. For example, in an alternative embodiment a single module having decoupled sub-modules can be used to perform all of the functions of methods 900a and 900b. Thus, other embodiments may have fewer or more modules and/or sub-modules depending on the granularity of implementation. In still other embodiments, the methodology depicted can be implemented as a computer program product including one or more non-transitory machine-readable mediums that when executed by one or more processors cause the methodology to be carried out. Numerous variations and alternative configurations will be apparent in light of this disclosure.

As illustrated in FIG. 9A, in an embodiment, method 900a for analog in-memory matrix multiplication commences by storing, at operation 910, a first matrix, in transposed form, to a first memory array region of a memory circuit which is configured for analog in-memory matrix multiplication. Next, at operation 920, a second matrix, in original (i.e., non-transposed) form, is stored to a second memory array region of the memory circuit. As a result of the transposition of the first matrix, the number of rows of the transposed first matrix equals the number of rows of the second matrix. In some embodiments, the first matrix includes inputs to a neural network and the second matrix includes weights of the neural network.

At operation 930, a bit line (BL) functional read (FR) circuit associated with the first memory array region generates a first vector of analog voltage values. Each of the analog voltage values are proportional to (or otherwise represent) data word elements in a column of the transposed first matrix. At operation 940, a BL FR circuit associated with the second memory array region generates a second vector of analog voltage values. Each of the analog voltage values of these analog voltage values are proportional to (or otherwise represent) data word elements in a column of the second matrix. The analog voltage values of the first vector are generated in parallel and the analog voltage values of the second vector are generated in parallel.

At operation 950, a BL analog circuit calculates an analog dot product between the first vector and the second vector. The analog dot product corresponds to an element of the product of the first matrix and the second matrix. The resulting element is associated with the column of the transposed first matrix (and thus the corresponding row of the first matrix) and the column of the second matrix.

The operations 930 through 950 are repeated over a series of first vectors and second vectors such that analog dot products are calculated to generate all elements of the matrix multiplication product based on all combinations of rows of the first matrix and columns of the second matrix.

In another embodiment, as illustrated in FIG. 9B, operations 910 and 920 are performed as described previously, to store the first matrix, in transposed form, to a first memory array region and to store the second matrix, in original (i.e., non-transposed) form, to the second memory array region of the memory circuit. At operation 960, however, a cross bit line (CBL) functional read (FR) circuit associated with the first memory array region generates a sequence of vectors of analog voltage values in parallel, each of the sequence of vectors associated with a column of the transposed first matrix. At operation 970, a BL FR circuit associated with the second memory array region generates an additional vector of analog voltage values proportional to (or otherwise represent) data word elements in a column of the second matrix. At operation 980, a CBL analog circuit calculates, in parallel, a sequence of analog dot products between each of the sequence of vectors associated with the first matrix and the additional vector associated with one of the columns of the second matrix. The operations 960 through 980 are repeated over a series of the additional vectors of the second matrix such that analog dot products are calculated to generate all elements of the matrix multiplication product based on all combinations of rows of the first matrix and columns of the second matrix.

Of course, in some embodiments, additional operations may be performed, as previously described in connection with the system. For example, additional operations may be performed to handle overflow conditions where either the number of columns or the number of rows of the matrices exceed the available number of columns or rows of the memory array regions of the memory circuit, as previously described.

Example System

Figure 10:
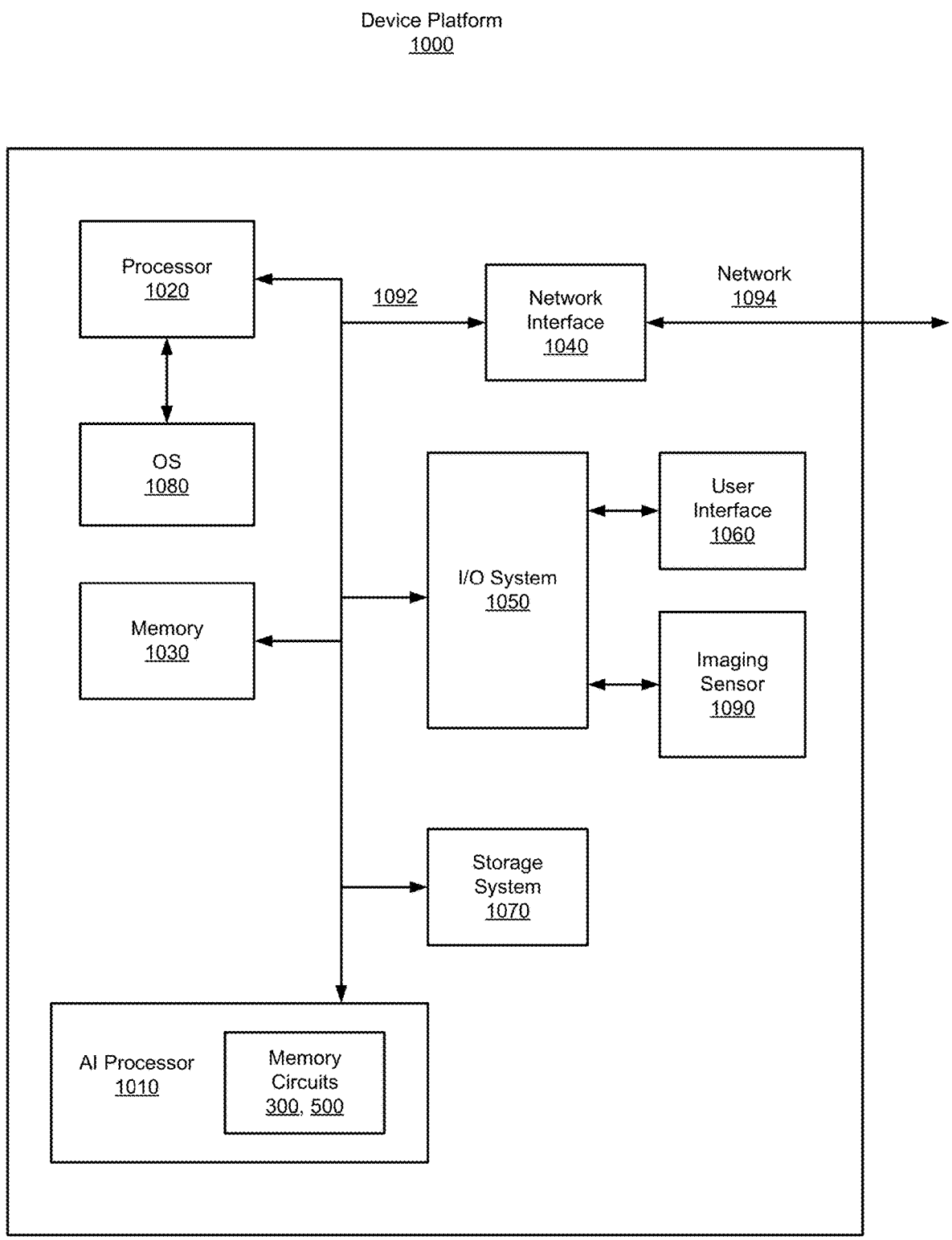
FIG. 10 is a block diagram schematically illustrating a computing platform configured to perform AI processing using analog in-memory matrix multiplication, in accordance with certain embodiments of the present disclosure.

FIG. 10 illustrates an example platform 1000 to perform AI processing using analog in-memory matrix multiplication, configured in accordance with certain embodiments of the present disclosure. In some embodiments, platform 1000 may be hosted on, or otherwise be incorporated into a personal computer, workstation, server system, smart home/smart car management system, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, wearable device, embedded system, and so forth. Any combination of different devices may be used in certain embodiments.

In some embodiments, platform 1000 may comprise any combination of a processor 1020, a memory 1030, an AI processor 1010 including memory circuits 300 and/or 500 configured to perform analog in-memory matrix multiplication, a network interface 1040, an input/output (I/O) system 1050, a user interface 1060, an imaging sensor 1090, and a storage system 1070. As can be further seen, a bus and/or interconnect 1092 is also provided to allow for communication between the various components listed above and/or other components not shown. Platform 1000 can be coupled to a network 1094 through network interface 1040 to allow for communications with other computing devices, platforms, devices to be controlled, or other resources. Other componentry and functionality not reflected in the block diagram of FIG. 10 will be apparent in light of this disclosure, and it will be appreciated that other embodiments are not limited to any particular hardware configuration.

Processor 1020 can be any suitable processor, and may include one or more coprocessors or controllers, such as an audio processor, a graphics processing unit, or hardware accelerator, to assist in control and processing operations associated with platform 1000. In some embodiments, the processor 1020 may be implemented as any number of processor cores. The processor (or processor cores) may be any type of processor, such as, for example, a microprocessor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core. Processor 1020 may be implemented as a complex instruction set computer (CISC) or a reduced instruction set computer (RISC) processor. In some embodiments, processor 1020 may be configured as an x86 instruction set compatible processor.

Memory 1030 can be implemented using any suitable type of digital storage including, for example, flash memory and/or random-access memory (RAM). In some embodiments, the memory 1030 may include various layers of memory hierarchy and/or memory caches as are known to those of skill in the art. Memory 1030 may be implemented as a volatile memory device such as, but not limited to, a RAM, dynamic RAM (DRAM), or static RAM (SRAM) device. Storage system 1070 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage 1070 may comprise technology to increase the storage performance enhanced protection for valuable digital media when multiple hard drives are included.

Processor 1020 may be configured to execute an Operating System (OS) 1080 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS). As will be appreciated in light of this disclosure, the techniques provided herein can be implemented without regard to the particular operating system provided in conjunction with platform 1000, and therefore may also be implemented using any suitable existing or subsequently-developed platform.

Network interface circuit 1040 can be any appropriate network chip or chipset which allows for wired and/or wireless connection between other components of platform 1000 and/or network 1094, thereby enabling platform 1000 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 1050 may be configured to interface between various I/O devices and other components of device platform 1000. I/O devices may include, but not be limited to, user interface 1060 and imaging sensor 1090. User interface 1060 may include devices (not shown) such as a microphone (or array of microphones), speaker, display element, touchpad, keyboard, and mouse, etc. I/O system 1050 may include a graphics subsystem configured to perform processing of images for rendering on the display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 1020 or any chipset of platform 1000. Imaging sensor 1090 may be configured to capture an image or series of images for further processing by AI processor 1010, for example to perform recognition or identification functions.

It will be appreciated that in some embodiments, the various components of platform 1000 may be combined or integrated in a system-on-a-chip (SoC) architecture. In some embodiments, the components may be hardware components, firmware components, software components or any suitable combination of hardware, firmware or software.

Memory circuits 300, 500 are configured to perform analog in-memory matrix multiplication with increased efficiency resulting from parallelism, as described previously. Memory circuits 300, 500 may include any or all of the circuits/components illustrated in FIGS. 3-7, as described above. These components can be implemented or otherwise used in conjunction with a variety of suitable software and/or hardware that is coupled to or that otherwise forms a part of platform 1000. These components can additionally or alternatively be implemented or otherwise used in conjunction with user I/O devices that are capable of providing information to, and receiving information from, a user.

In some embodiments, these circuits may be installed local to platform 1000, as shown in the example embodiment of FIG. 10. Alternatively, platform 1000 can be implemented in a client-server arrangement wherein at least some functionality associated with these circuits is provided to platform 1000 using an applet, such as a JavaScript applet, or other downloadable module or set of sub-modules. Such remotely accessible modules or sub-modules can be provisioned in real-time, in response to a request from a client computing system for access to a given server having resources that are of interest to the user of the client computing system. In such embodiments, the server can be local to network 1094 or remotely coupled to network 1094 by one or more other networks and/or communication channels. In some cases, access to resources on a given network or computing system may require credentials such as usernames, passwords, and/or compliance with any other suitable security mechanism.

In various embodiments, platform 1000 may be implemented as a wireless system, a wired system, or a combination of both. When implemented as a wireless system, platform 1000 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, platform 1000 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the matrix multiplication methodologies disclosed herein to be implemented. The instructions can be encoded using a suitable programming language, such as C, C++, object oriented C, Java, JavaScript, Visual Basic .NET, Beginner's All-Purpose Symbolic Instruction Code (BASIC), or alternatively, using custom or proprietary instruction sets. The instructions can be provided in the form of one or more computer software applications and/or applets that are tangibly embodied on a memory device, and that can be executed by a computer having any suitable architecture. In one embodiment, the system can be hosted on a given website and implemented, for example, using JavaScript or another suitable browser-based technology. For instance, in certain embodiments, the system may leverage processing resources provided by a remote computer system accessible via network 1094. In other embodiments, the functionalities disclosed herein can be incorporated into other software applications, such as, for example, automobile control/navigation, smart-home management, entertainment, and robotic applications. The computer software applications disclosed herein may include any number of different modules, sub-modules, or other components of distinct functionality, and can provide information to, or receive information from, still other components. These modules can be used, for example, to communicate with input and/or output devices such as an imaging sensor, a display screen, a touch sensitive surface, a printer, and/or any other suitable device. Other componentry and functionality not reflected in the illustrations will be apparent in light of this disclosure, and it will be appreciated that other embodiments are not limited to any particular hardware or software configuration. Thus, in other embodiments platform 1000 may comprise additional, fewer, or alternative subcomponents as compared to those included in the example embodiment of FIG. 10.

The aforementioned non-transitory computer readable medium may be any suitable medium for storing digital information, such as a hard drive, a server, a flash memory, and/or random-access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method, process, and/or operations in accordance with the embodiments. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CD-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical entities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), desktop computers, laptop computers, tablet computers, servers, smart phones, etc. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is an analog in-memory matrix multiplication system comprising: a memory circuit including a first memory array region to store a first matrix in transposed form, and a second memory array region to store a second matrix in non-transposed form, wherein a row count of the transposed first matrix equals a row count of the second matrix; a first bit line (BL) functional read (FR) circuit associated with the first memory array region, the first BL FR circuit to generate a first vector of analog voltage values, each of the analog voltage values of the first vector proportional to a data word element in a column of the transposed first matrix; a second BL FR circuit associated with the second memory array region, the second BL FR circuit to generate a second vector of analog voltage values, each of the analog voltage values of the second vector proportional to a data word element in a column of the second matrix; and a BL analog processing circuit, the BL analog processing circuit to calculate an analog dot product between the first vector and the second vector, the analog dot product corresponding to an element of a matrix multiplication product of the first matrix and the second matrix, the element associated with the column of the transposed first matrix and the column of the second matrix.

Example 2 includes the subject matter of Example 1, wherein the analog voltage values of the first vector are generated in parallel and the analog voltage values of the second vector are generated in parallel.

Example 3 includes the subject matter of Examples 1 or 2, wherein the BL analog processing circuit is further to calculate a plurality of the analog dot products based on a sequence of the first vectors and a sequence of the second vectors, each of the analog dot products corresponding to an element of the matrix multiplication product of the first matrix and the second matrix, the sequence of the first vectors associated with the columns of the transposed first matrix, the sequence of the second vectors associated with the columns of the second matrix.

Example 4 includes the subject matter of any of Examples 1-3, wherein the memory circuit is a primary memory circuit, the system further comprising an overflow memory circuit including a third memory array region to store a portion of the first matrix in transposed form, the portion including a number of columns of the first matrix that exceed a number of available columns of the first memory array region, the overflow memory circuit further including a fourth memory array region to store the second matrix in non-transposed form.

Example 5 includes the subject matter of any of Examples 1-4, wherein the memory circuit is a primary memory circuit, the system further comprising: an overflow memory circuit including a third memory array region to store a portion of the first matrix in transposed form, the portion of the first matrix including a number of rows of the first matrix that exceed a number of available rows of the first memory array region, the overflow memory circuit further including a fourth memory array region to store a portion of the second matrix in non-transposed form, the portion of the second matrix including a number of rows of the second matrix that exceed a number of available rows of the second memory array region; and an adder circuit to calculate a full analog dot product based on a sum of a first partial analog dot product generated by the BL analog processing circuit of the primary memory circuit, and a second partial analog dot product generated by a BL analog processing circuit of the overflow memory circuit.

Example 6 includes the subject matter of any of Examples 1-5, wherein the first matrix includes inputs to an analog neural network and the second matrix includes weights of the analog neural network.

Example 7 is a multi-layer analog neural network comprising one or more cascaded analog in-memory matrix multiplication systems of any of Examples 1-6.

Example 8 is an integrated circuit or chip set comprising the network of any of Examples 1-7.

Example 9 is an on-chip memory or cache comprising the network of any of Examples 1-8.

Example 10 is a processor comprising the on-chip memory or cache of any of Examples 1-9.

Example 11 is a processor comprising the network of any of Examples 1-10.

Example 12 is an analog in-memory matrix multiplication system comprising: a memory circuit including a first memory array region to store a first matrix in transposed form, and a second memory array region to store a second matrix in non-transposed form, wherein a row count of the transposed first matrix equals a row count of the second matrix; a cross bit line (CBL) functional read (FR) circuit associated with the first memory array region, the CBL FR circuit to generate a sequence of vectors of analog voltage values, each of the sequence of vectors associated with a column of the transposed first matrix, each of the analog voltage values proportional to a data word element in the associated column of the transposed first matrix; a bit line (BL) FR circuit associated with the second memory array region, the BL FR circuit to generate an additional vector of analog voltage values, each of the analog voltage values of the additional vector proportional to a data word element in a column of the second matrix; and a CBL analog processing circuit, the CBL analog processing circuit to calculate a sequence of analog dot products, each of the analog dot products calculated between one of the sequence of vectors and the additional vector, each of the analog dot products corresponding to an element of a matrix multiplication product of the first matrix and the second matrix, the elements associated with the columns of the transposed first matrix and the column of the second matrix.

Example 13 includes the subject matter of Example 12, wherein the analog voltage values of the sequence of vectors are generated in parallel and the analog voltage values of the additional vector are generated in parallel.

Example 14 includes the subject matter of Examples 12 or 13, wherein the analog dot products, of the sequence of analog dot products, are calculated in parallel.

Example 15 includes the subject matter of any of Examples 12-14, wherein the CBL analog processing circuit is further to calculate a plurality of the sequence of analog dot products based on a sequence of the additional vectors associated with each of the columns of the second matrix.

Example 16 includes the subject matter of any of Examples 12-15, wherein the memory circuit is a primary memory circuit, the system further comprising an overflow memory circuit including a third memory array region to store a portion of the first matrix in transposed form, the portion including a number of columns of the first matrix that exceed a number of available columns of the first memory array region, the overflow memory circuit further including a fourth memory array region to store the second matrix in non-transposed form.

Example 17 includes the subject matter of any of Examples 12-16, wherein the memory circuit is a primary memory circuit, the system further comprising: an overflow memory circuit including a third memory array region to store a portion of the first matrix in transposed form, the portion of the first matrix including a number of rows of the first matrix that exceed a number of available rows of the first memory array region; the overflow memory circuit further including a fourth memory array region to store a portion of the second matrix in non-transposed form, the portion of the second matrix including a number of rows of the second matrix that exceed a number of available rows of the second memory array region; and an adder circuit to calculate a full analog dot product based on a sum of a first partial analog dot product generated by the CBL analog processing circuit of the primary memory circuit, and a second partial analog dot product generated by a CBL analog processing circuit of the overflow memory circuit.

Example 18 includes the subject matter of any of Examples 12-17, wherein the first matrix includes inputs to an analog neural network and the second matrix includes weights of the analog neural network.

Example 19 is a multi-layer analog neural network comprising one or more cascaded analog in-memory matrix multiplication systems of any of Examples 12-18.

Example 20 is an integrated circuit or chip set comprising the network of any of Examples 12-19.

Example 21 is an on-chip memory or cache comprising the network of any of Examples 12-20.

Example 22 is a processor comprising the on-chip memory or cache of any of Examples 12-21.

Example 23 is a processor comprising the network of any of Examples 12-22.

Example 24 is a method for analog in-memory matrix multiplication, the method comprising: storing, by a processor-based system, a first matrix, in transposed form, to a first memory array region of a memory circuit; storing, by the processor-based system, a second matrix, in non-transposed form, to a second memory array region of the memory circuit, wherein a row count of the transposed first matrix equals a row count of the second matrix; generating, by a first bit line (BL) functional read (FR) circuit associated with the first memory array region, a first vector of analog voltage values, each of the analog voltage values of the first vector proportional to a data word element in a column of the transposed first matrix; generating, by a second BL FR circuit associated with the second memory array region, a second vector of analog voltage values, each of the analog voltage values of the second vector proportional to a data word element in a column of the second matrix; and calculating, by a BL analog processing circuit, an analog dot product between the first vector and the second vector, the analog dot product corresponding to an element of a matrix multiplication product of the first matrix and the second matrix, the element associated with the column of the transposed first matrix and the column of the second matrix.

Example 25 includes the subject matter of Example 24, wherein the analog voltage values of the first vector are generated in parallel and the analog voltage values of the second vector are generated in parallel.

Example 26 includes the subject matter of Examples 24 or 25, further comprising calculating, by the BL analog processing circuit, a plurality of the analog dot products based on a sequence of the first vectors and a sequence of the second vectors, each of the analog dot products corresponding to an element of the matrix multiplication product of the first matrix and the second matrix, the sequence of the first vectors associated with the columns of the transposed first matrix, the sequence of the second vectors associated with the columns of the second matrix.

Example 27 includes the subject matter of any of Examples 24-26, wherein the first matrix includes inputs to an analog neural network and the second matrix includes weights of the analog neural network.

Example 28 is a method for analog in-memory matrix multiplication, the method comprising: storing, by a processor-based system, a first matrix, in transposed form, to a first memory array region of a memory circuit; storing, by the processor-based system, a second matrix, in non-transposed form, to a second memory array region of the memory circuit, wherein a row count of the transposed first matrix equals a row count of the second matrix; generating, by a cross bit line (CBL) functional read (FR) circuit associated with the first memory array region, a sequence of vectors of analog voltage values, each of the sequence of vectors associated with a column of the transposed first matrix, each of the analog voltage values proportional to a data word element in the associated column of the transposed first matrix; generating, by a bit line (BL) FR circuit associated with the second memory array region, an additional vector of analog voltage values, each of the analog voltage values of the additional vector proportional to a data word element in a column of the second matrix; and calculating, by a CBL analog processing circuit, a sequence of analog dot products, each of the analog dot products calculated between one of the sequence of vectors and the additional vector, each of the analog dot products corresponding to an element of a matrix multiplication product of the first matrix and the second matrix, the elements associated with the columns of the transposed first matrix and the column of the second matrix.

Example 29 includes the subject matter of Example 28, wherein the analog voltage values of the sequence of vectors are generated in parallel and the analog voltage values of the additional vector are generated in parallel.

Example 30 includes the subject matter of Examples 28 or 29, wherein the analog dot products, of the sequence of analog dot products, are calculated in parallel.

Example 31 includes the subject matter of any of Examples 28-30, further comprising calculating, by the CBL analog processing circuit, a plurality of the sequence of analog dot products based on a sequence of the additional vectors associated with each of the columns of the second matrix.

Example 32 includes the subject matter of any of Examples 28-31, wherein the first matrix includes inputs to an analog neural network and the second matrix includes weights of the analog neural network.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. An analog in-memory matrix multiplication system comprising:
   a memory circuit including a first memory array region to store a first matrix in transposed form, and a second memory array region to store a second matrix in non-transposed form, wherein a row count of the transposed first matrix equals a row count of the second matrix;
   a first bit line (BL) functional read (FR) circuit associated with the first memory array region, the first BL FR circuit to generate a first vector of analog voltage values, each of the analog voltage values of the first vector proportional to a data word element in a column of the transposed first matrix;
   a second BL FR circuit associated with the second memory array region, the second BL FR circuit to generate a second vector of analog voltage values, each of the analog voltage values of the second vector proportional to a data word element in a column of the second matrix; and
   a BL analog processing circuit, the BL analog processing circuit to calculate an analog dot product between the first vector and the second vector, the analog dot product corresponding to an element of a matrix multiplication product of the first matrix and the second matrix, the element associated with the column of the transposed first matrix and the column of the second matrix.

2. The system of claim 1, wherein the analog voltage values of the first vector are generated in parallel and the analog voltage values of the second vector are generated in parallel.

3. The system of claim 1, wherein the BL analog processing circuit is further to calculate a plurality of the analog dot products based on a sequence of the first vectors and a sequence of the second vectors, each of the analog dot products corresponding to an element of the matrix multiplication product of the first matrix and the second matrix, the sequence of the first vectors associated with the columns of the transposed first matrix, the sequence of the second vectors associated with the columns of the second matrix.

4. The system of claim 1, wherein the memory circuit is a primary memory circuit, the system further comprising an overflow memory circuit including a third memory array region to store a portion of the first matrix in transposed form, the portion including a number of columns of the first matrix that exceed a number of available columns of the first memory array region, the overflow memory circuit further including a fourth memory array region to store the second matrix in non-transposed form.

5. The system of claim 1, wherein the memory circuit is a primary memory circuit, the system further comprising:
   an overflow memory circuit including a third memory array region to store a portion of the first matrix in transposed form, the portion of the first matrix including a number of rows of the first matrix that exceed a number of available rows of the first memory array region, the overflow memory circuit further including a fourth memory array region to store a portion of the second matrix in non-transposed form, the portion of the second matrix including a number of rows of the second matrix that exceed a number of available rows of the second memory array region; and
   an adder circuit to calculate a full analog dot product based on a sum of a first partial analog dot product generated by the BL analog processing circuit of the primary memory circuit, and a second partial analog dot product generated by a BL analog processing circuit of the overflow memory circuit.

6. The system of claim 1, wherein the first matrix includes inputs to an analog neural network and the second matrix includes weights of the analog neural network.

7. A multi-layer analog neural network comprising one or more cascaded analog in-memory matrix multiplication systems of claim 1.

8. An integrated circuit or chip set comprising the network of claim 7.

9. An on-chip memory or cache comprising the network of claim 7.

10. A processor comprising the on-chip memory or cache of claim 9.

11. A processor comprising the network of claim 7.

12. An analog in-memory matrix multiplication system comprising:
   a memory circuit including a first memory array region to store a first matrix in transposed form, and a second memory array region to store a second matrix in non-transposed form, wherein a row count of the transposed first matrix equals a row count of the second matrix;
   a cross bit line (CBL) functional read (FR) circuit associated with the first memory array region, the CBL FR circuit to generate a sequence of vectors of analog voltage values, each of the sequence of vectors associated with a column of the transposed first matrix, each of the analog voltage values proportional to a data word element in the associated column of the transposed first matrix;
   a bit line (BL) FR circuit associated with the second memory array region, the BL FR circuit to generate an additional vector of analog voltage values, each of the analog voltage values of the additional vector proportional to a data word element in a column of the second matrix; and
   a CBL analog processing circuit, the CBL analog processing circuit to calculate a sequence of analog dot products, each of the analog dot products calculated between one of the sequence of vectors and the additional vector, each of the analog dot products corresponding to an element of a matrix multiplication product of the first matrix and the second matrix, the elements associated with the columns of the transposed first matrix and the column of the second matrix.

13. The system of claim 12, wherein the analog voltage values of the sequence of vectors are generated in parallel and the analog voltage values of the additional vector are generated in parallel.

14. The system of claim 12, wherein the analog dot products, of the sequence of analog dot products, are calculated in parallel.

15. The system of claim 12, wherein the CBL analog processing circuit is further to calculate a plurality of the sequence of analog dot products based on a sequence of the additional vectors associated with each of the columns of the second matrix.

16. The system of claim 12, wherein the memory circuit is a primary memory circuit, the system further comprising an overflow memory circuit including a third memory array region to store a portion of the first matrix in transposed form, the portion including a number of columns of the first matrix that exceed a number of available columns of the first memory array region, the overflow memory circuit further including a fourth memory array region to store the second matrix in non-transposed form.

17. The system of claim 12, wherein the memory circuit is a primary memory circuit, the system further comprising:
an overflow memory circuit including a third memory array region to store a portion of the first matrix in transposed form, the portion of the first matrix including a number of rows of the first matrix that exceed a number of available rows of the first memory array region;
the overflow memory circuit further including a fourth memory array region to store a portion of the second matrix in non-transposed form, the portion of the second matrix including a number of rows of the second matrix that exceed a number of available rows of the second memory array region; and
an adder circuit to calculate a full analog dot product based on a sum of a first partial analog dot product generated by the CBL analog processing circuit of the primary memory circuit, and a second partial analog dot product generated by a CBL analog processing circuit of the overflow memory circuit.

18. The system of claim 12, wherein the first matrix includes inputs to an analog neural network and the second matrix includes weights of the analog neural network.

19. A multi-layer analog neural network comprising one or more cascaded analog in-memory matrix multiplication systems of claim 12.

20. An integrated circuit or chip set comprising the network of claim 19.

21. An on-chip memory or cache comprising the network of claim 19.

22. A processor comprising the on-chip memory or cache of claim 21.

23. A processor comprising the network of claim 19.

24. A method for analog in-memory matrix multiplication, the method comprising:
storing, by a processor-based system, a first matrix, in transposed form, to a first memory array region of a memory circuit;
storing, by the processor-based system, a second matrix, in non-transposed form, to a second memory array region of the memory circuit, wherein a row count of the transposed first matrix equals a row count of the second matrix;
generating, by a first bit line (BL) functional read (FR) circuit associated with the first memory array region, a first vector of analog voltage values, each of the analog voltage values of the first vector proportional to a data word element in a column of the transposed first matrix;
generating, by a second BL FR circuit associated with the second memory array region, a second vector of analog voltage values, each of the analog voltage values of the second vector proportional to a data word element in a column of the second matrix; and
calculating, by a BL analog processing circuit, an analog dot product between the first vector and the second vector, the analog dot product corresponding to an element of a matrix multiplication product of the first matrix and the second matrix, the element associated with the column of the transposed first matrix and the column of the second matrix.

25. A method for analog in-memory matrix multiplication, the method comprising:
storing, by a processor-based system, a first matrix, in transposed form, to a first memory array region of a memory circuit;
storing, by the processor-based system, a second matrix, in non-transposed form, to a second memory array region of the memory circuit, wherein a row count of the transposed first matrix equals a row count of the second matrix;
generating, by a cross bit line (CBL) functional read (FR) circuit associated with the first memory array region, a sequence of vectors of analog voltage values, each of the sequence of vectors associated with a column of the transposed first matrix, each of the analog voltage values proportional to a data word element in the associated column of the transposed first matrix;
generating, by a bit line (BL) FR circuit associated with the second memory array region, an additional vector of analog voltage values, each of the analog voltage values of the additional vector proportional to a data word element in a column of the second matrix; and
calculating, by a CBL analog processing circuit, a sequence of analog dot products, each of the analog dot products calculated between one of the sequence of vectors and the additional vector, each of the analog dot products corresponding to an element of a matrix multiplication product of the first matrix and the second matrix, the elements associated with the columns of the transposed first matrix and the column of the second matrix.

* * * * *